United States Patent
Fayet et al.

(10) Patent No.: US 10,889,092 B2
(45) Date of Patent: Jan. 12, 2021

(54) LAMINATED BARRIER FILM AND EDGE-COVERING STRIP FOR PACKAGING

(71) Applicant: Tetra Laval Holdings & Finance S.A., Pully (CH)

(72) Inventors: Pierre Fayet, Lausanne (CH); Cesare Lorenzetti, Bulle (CH); Jerome Larrieu, Bulle (CH); Francesco Pisciotti, Veberöd (SE)

(73) Assignee: TETRA LAVAL HOLDINGS & FINANCE S.A., Pully (CH)

( * ) Notice: Subject to any disclaimer, the term of this patent is extended or adjusted under 35 U.S.C. 154(b) by 281 days.

(21) Appl. No.: 15/772,510

(22) PCT Filed: Oct. 25, 2016

(86) PCT No.: PCT/EP2016/075694
§ 371 (c)(1),
(2) Date: Apr. 30, 2018

(87) PCT Pub. No.: WO2017/072121
PCT Pub. Date: May 4, 2017

(65) Prior Publication Data
US 2019/0077131 A1    Mar. 14, 2019

(30) Foreign Application Priority Data

Oct. 29, 2015 (EP) .................................. 15192206
Oct. 29, 2015 (EP) .................................. 15192208
Oct. 29, 2015 (EP) .................................. 15192211

(51) Int. Cl.
*B32B 1/08*    (2006.01)
*B32B 27/08*   (2006.01)
(Continued)

(52) U.S. Cl.
CPC ............ *B32B 27/08* (2013.01); *B32B 7/12* (2013.01); *B32B 27/10* (2013.01); *B32B 27/306* (2013.01);
(Continued)

(58) Field of Classification Search
CPC .. B32B 7/02; B32B 7/12; B32B 27/08; Y10T 428/31725
(Continued)

(56) References Cited

U.S. PATENT DOCUMENTS

2006/0150908 A1    7/2006  Fayet et al.
2012/0100320 A1*   4/2012  Toft .................. B32B 7/02
                                              428/35.6

FOREIGN PATENT DOCUMENTS

CN    103608178 A    2/2014
EP    0575299 A1    12/1993
(Continued)

OTHER PUBLICATIONS

EPO International Search Report in PCT/EP2016/075694 dated Jan. 2, 2017 in 14 pages.
(Continued)

*Primary Examiner* — Ellen S Hock
(74) *Attorney, Agent, or Firm* — Knobbe, Martens, Olson & Bear, LLP

(57) ABSTRACT

Laminated barrier films that include a PECVD barrier coating of diamond-like carbon are disclosed, along with a method of manufacturing such films, and edge-covering strips made from such films, in particular intended for liquid carton packaging are disclosed. Packaging containers that include the edge-covering strip and in particular to a packaging container intended for liquid food packaging are also disclosed.

14 Claims, 9 Drawing Sheets

Figure 1A:
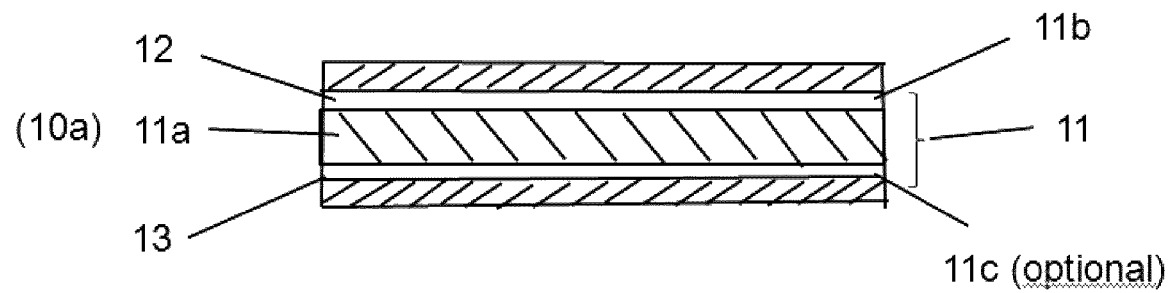

(51) Int. Cl.
| | |
|---|---|
| B32B 7/12 | (2006.01) |
| B32B 27/32 | (2006.01) |
| B32B 27/36 | (2006.01) |
| B65D 85/72 | (2006.01) |
| B65D 8/00 | (2006.01) |
| B65D 75/12 | (2006.01) |
| B65D 75/48 | (2006.01) |
| B65D 5/06 | (2006.01) |
| B65B 1/02 | (2006.01) |
| B65D 5/56 | (2006.01) |
| B32B 27/30 | (2006.01) |
| B65B 7/28 | (2006.01) |
| B65B 51/26 | (2006.01) |
| B65B 9/20 | (2012.01) |
| B65D 5/62 | (2006.01) |
| B32B 27/10 | (2006.01) |
| B32B 27/34 | (2006.01) |
| C23C 16/27 | (2006.01) |
| B65D 5/74 | (2006.01) |

(52) U.S. Cl.
CPC ............ *B32B 27/32* (2013.01); *B32B 27/325* (2013.01); *B32B 27/34* (2013.01); *B32B 27/36* (2013.01); *B65B 1/02* (2013.01); *B65B 7/2878* (2013.01); *B65B 9/2049* (2013.01); *B65B 51/26* (2013.01); *B65D 5/064* (2013.01); *B65D 5/067* (2013.01); *B65D 5/563* (2013.01); *B65D 5/62* (2013.01); *B65D 11/04* (2013.01); *B65D 15/02* (2013.01); *B65D 75/12* (2013.01); *B65D 75/48* (2013.01); *B65D 85/72* (2013.01); *C23C 16/27* (2013.01); *B32B 2255/00* (2013.01); *B32B 2255/10* (2013.01); *B32B 2255/20* (2013.01); *B32B 2307/7244* (2013.01); *B32B 2307/7246* (2013.01); *B32B 2307/7248* (2013.01); *B32B 2439/46* (2013.01); *B32B 2439/60* (2013.01); *B32B 2439/62* (2013.01); *B32B 2439/70* (2013.01); *B65D 5/746* (2013.01)

(58) Field of Classification Search
USPC .................................. 428/35.6, 537.5, 34.1
See application file for complete search history.

(56) References Cited

FOREIGN PATENT DOCUMENTS

| | | |
|---|---|---|
| JP | 2002 200694 A | 7/2002 |
| JP | 2004 314407 A | 11/2004 |
| JP | 2005 088452 A | 4/2005 |
| JP | 2008 248374 A | 10/2008 |
| WO | WO 2007/032719 A1 | 3/2007 |
| WO | WO 2013/041469 A1 | 3/2013 |
| WO | WO 2013/152276 A2 | 10/2013 |

OTHER PUBLICATIONS

EPO Extended Search Report in Application No. 15192208.5 dated Feb. 1, 2016 in 5 pages.
Search Report, corresponding Russian application No. 2018117665, dated Feb. 6, 2020.

* cited by examiner

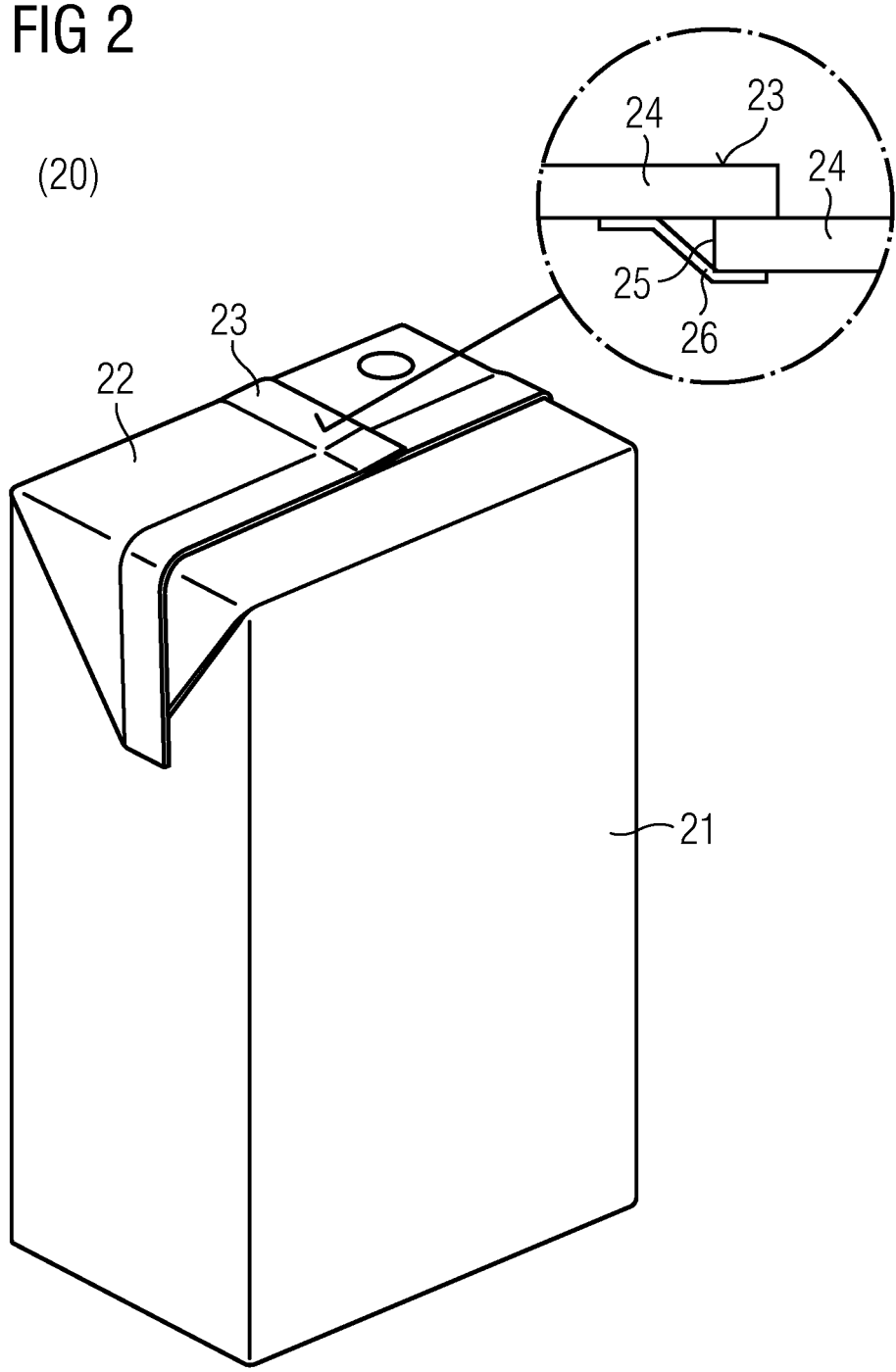

LAMINATED BARRIER FILM AND EDGE-COVERING STRIP FOR PACKAGING

TECHNICAL FIELD

The present invention relates to a laminated barrier film comprising a base layer having a vapour deposited barrier coating of amorphous diamond-like carbon, in particular intended for liquid food packaging, and to a method for manufacturing the laminated barrier film.

Furthermore, the invention relates to a heat sealable edge-covering strip made from the laminated barrier film of the invention and to a packaging container comprising the strip, in order to cover an overlap seam or overlap seal of the packaging material, from which the packaging container is manufactured by fold-forming and heat sealing. In particular, the invention relates to a packaging container intended for liquid food packaging, comprising the laminated barrier film or heat sealable edge-covering strip.

BACKGROUND OF THE INVENTION

Packaging containers of the single use disposable type for liquid foods are often produced from a packaging laminate based on paperboard or carton. One such commonly occurring packaging container is marketed under the trademark Tetra Brik Aseptic® and is principally employed for aseptic packaging of liquid foods such as milk, fruit juices etc, sold for long term ambient storage. The packaging material in this known packaging container is typically a laminate comprising a bulk or core layer of paper or paperboard and outer, liquid-tight layers of thermoplastics. In order to render the packaging container gas-tight, in particular oxygen gas-tight, for example for the purpose of aseptic packaging and packaging of milk or fruit juice, the laminate in these packaging containers normally comprises at least one additional layer, most commonly an aluminium foil.

On the inside of the laminate, i.e. the side intended to face the filled food contents of a container produced from the laminate, there is an innermost layer, applied onto the aluminium foil, which innermost, inside layer may be composed of one or several part layers, comprising heat sealable thermoplastic polymers, such as adhesive polymers and/or polyolefins. Also on the outside of the bulk layer, there is an outermost heat sealable polymer layer.

The packaging containers are generally produced by means of modern, high-speed packaging machines of the type that form, fill and seal packages from a web or from prefabricated blanks of packaging material. Packaging containers may thus be produced by reforming a web of the laminated packaging material into a tube by both of the longitudinal edges of the web being united to each other in an overlap joint by welding together the inner- and outermost heat sealable thermoplastic polymer layers. The tube is filled with the intended liquid food product and is thereafter divided into individual packages by repeated transversal seals of the tube at a predetermined distance from each other and below the level of the contents in the tube. The packages are separated from the tube by incisions along the transversal seals and are given the desired geometric configuration, normally parallelepipedic or cuboid, by fold formation along prepared crease lines in the packaging material.

The main advantage of this continuous tube-forming, filling and sealing packaging method concept is that the web may be sterilised continuously just before tube-forming, thus providing for the possibility of an aseptic packaging method, i.e. a method wherein the liquid content to be filled as well as the packaging material itself are reduced from bacteria and the filled packaging container is produced under clean conditions such that the filled package may be stored for a long time even at ambient temperature without the risk of growth of micro-organisms in the filled product. Another important advantage of the Tetra Brik®-type packaging method is, as stated above, the possibility of continuous high-speed packaging, which has considerable impact on cost efficiency.

Packaging containers for sensitive liquid food, for example milk or juice, can also be produced from sheet-like blanks or prefabricated blanks of the laminated packaging material of the invention. From a tubular blank of the packaging laminate that is folded flat, packages are produced by first of all building the blank up to form an open tubular container capsule, of which one open end is closed off by means of folding and heat-sealing of integral end panels. The thus closed container capsule is filled with the food product in question, e.g. juice, through its open end, which is thereafter closed off by means of further folding and heat-sealing of corresponding integral end panels. An example of a packaging container produced from sheet-like and tubular blanks is the conventional so-called gable-top package. There are also packages of this type which have a moulded top and/or screw cap made of plastic.

A layer of an aluminium foil in the packaging laminate provides gas barrier properties quite superior to most polymeric gas barrier materials. The conventional aluminium-foil based packaging laminate for liquid food aseptic packaging is still the most cost-efficient packaging material, at its level of performance, available on the market today, but other barrier material layers, such as polyamides or ethylene vinyl alcohol copolymers (EVOH), may also be used.

Packages which are produced according to any of the above-described form/fill/seal technique display both interior and exterior freely exposed incision edges in the region of the above mentioned overlap joint. Such incision edges seldom or never cause problems when the packaging containers are filled with solid or semi solid contents, while, on the other hand, problems do occur when the packaging containers are filled with liquid contents. In particular, there is a problem when the packaging containers are produced from a packaging laminate comprising a layer of paper or paperboard. The free incision edges of the paperboard, which are in direct contact with the liquid contents, readily absorb liquid (edge wicking) which may thereby penetrate into the laminated packaging material comprising a paper or paperboard layer, and renders the filled packaging container sloppy and unmanageable.

In order to counteract the problem in edge wicking, the paper- or paperboard based packaging containers are therefore provided with an edge covering protection, most often in the form of a laminated heat sealable edge-covering strip, which is applied on the inside of the packaging container in order to protect the edge wicking fibre incision edge from direct contact with the liquid contents.

According to one method, such an edge covering strip is applied and secured in a filling machine along the one longitudinal edge of the planar packaging material web such that it has a free strip edge projecting out from the longitudinal edge. The planar packaging material web provided with the strip is thereafter reformed into a tube in that, as was described above, both longitudinal edges of the web are folded towards and permanently united to one another in an overlap joint. During the tube forming in the filling machine, the projecting free strip edge is folded into planar abutment against the overlapping inside of the second longitudinal web edge and is fixedly sealed thereto by thermosealing in such a manner that the incision edge of the first longitudinal web edge facing towards the interior of the tube is completely covered and protected against edge wicking.

According to another method, the projecting free strip edge is folded around the incision edge of the first longitudinal web edge into planar abutment against the other side (outside) of the first longitudinal web edge against which it is secured prior to the reforming of the web into a tube. Both of the longitudinal edges of the web are thereafter folded, as in the previous case, against one another and permanently united to one another in an overlap joint by thermosealing.

Regardless of whether the edge covering strip is applied according to the first or the second of the two above described methods, it is naturally a requirement in both cases that the entire strip application and edge covering cycle may be completed in such a manner that the requisite protection against edge wicking is ensured by the applied edge covering strip. Consequently, in order to satisfy this requirement, the strip must be thermosealable to counterfacing sealing surfaces of the packaging material, and further it must be possible to carry out the thermosealing operation efficiently and expediently even at the high production output speeds at which today's modern filling machines operate. This requirement is of particular importance in the production of so-called aseptic packaging containers in which a packed food is intended to be stored reliably for a very long shelf life, without either the packaging container or the food packed in the packaging container running the risk of being destroyed or becoming unusable during its shelf life.

A prior art edge covering strip in a commercial paper or paperboard based packaging container comprising a layer of paper or paperboard and outer, liquid-tight coatings of polyethylene, normally low density polyethylene (LDPE), has a base layer of polyethylene terephthalate (PET) and outer, thermosealable plastic coatings of polyethylene, for example low density polyethylene (LDPE).

Another prior art strip for the same purpose displays a base layer of polyethylene terephthalate (PET) and outer, thermosealable plastic coatings comprising a metallocene-catalysed linear low density polyethylene, metallocene-LL-DPE (mLLDPE). The advantage of including such a polyethylene in the outermost thermosealable layer is that a more robust, strong and long-lasting sealing joint can be formed, because such polyethylenes can widen the temperature-window of operation at which a sufficiently strong heat seal may be formed.

Some base layers, when comprising moisture-sensitive polymer materials, such as polyamides or ethylene vinyl alcohol copolymers, may deteriorate when exposed to moisture or wet conditions, which is the case when used as edge-covering strips on the inside of a liquid packaging container. The polymer material in the base layer may then swell and lose its oxygen and aroma barrier properties, as well as be caused to delaminate from adjacent adhesives, primers and polyolefin layers, which are normally surrounding the base layer in such a laminated edge-covering strip. In order to keep the adhesion between the layers, in the wet or humid conditions, adhesives or primers may be needed in the laminated structure. Many such adhesives or primers are not preferred to have in contact with food and beverage. The group of possible of adhesives or primers for use in such a strip, may consequently be confined to just a very few that are thus both suitable for food packaging and able to maintain sufficient barrier properties. Such an extra adhesive material or adhesive polymer also brings further complexity and costs to the laminated barrier structure.

DISCLOSURE OF THE INVENTION

It is, accordingly, an object of the present invention to overcome, or at least alleviate, the above-described problems in heat-sealable laminated barrier films, and heat sealable edge-covering strips and patches for packaging.

One object of the present invention is to provide a laminated barrier film having maintained oxygen barrier and sealing properties when used as an edge covering strip in packaging containers for liquid food.

It is another object to provide a laminated barrier film having improved oxygen barrier properties as well as good sealing properties when used as an edge covering strip in packaging containers for liquid food.

It is a further object to provide a laminated barrier film having improved oxygen barrier properties, maintained barrier properties to aroma substances and improved resistance to chemical substances as well as good sealing properties when used as an edge covering strip in packaging containers for liquid food.

A yet further object is to provide such a laminated barrier film having good integrity, which is maintained under humid and wet conditions, as well as when exposed to aggressive migrating food substances such as free fatty acids and the like, i.e. which has good adhesion between the laminated layers within the film structure under liquid food packaging conditions.

A yet further object is to provide a laminated barrier film according to any of the above, without the use of additional chemical primers or adhesives, which may be less preferable from environmental and food safety aspects, and which will enable improved production efficiency.

One particular object of the invention is to realise a method of producing such a barrier film and edge-covering strip for aseptic packaging containers for liquid foods, which will enable improved production efficiency and reduce the number of manufacturing steps, such as eliminating steps for drying of primers etc.

It is also an object of the invention to provide a packaging container for long-term aseptic storage of liquid food at maintained nutritional quality under ambient conditions from a paper- or paperboard-based and heat-sealable packaging laminate having good gas barrier properties, in which packaging container the inside overlap edges are sealed and covered with an edge-covering strip of the invention.

These objects are thus attainable according to the present invention by the laminated barrier film, the edge-covering strip and the method of manufacturing the laminated barrier film, as well as the packaging container, as defined in the appended claims.

With the term "long-term storage" in connection with the present invention, is meant that the packaging container should be able to preserve the qualities of the packed food product, i.e. nutritional value, hygienic safety and taste, at ambient conditions for at least 1 or 2 months, such as at least 3 months, preferably longer, such as 6 months, such as 12 months, or more. With the term "package integrity", is generally meant the package durability, i.e. the resistance to leakage of a packaging container. A main contribution to this property is that within a packaging laminate there is provided good internal adhesion between adjacent layers of the laminated packaging material. Another contribution comes from the material resistance to defects, such as pinholes, ruptures and the like within the material layers, and yet another contribution comes from the strength of the sealing joints, by which the material is sealed together at the formation of a packaging container. Regarding the laminated packaging material itself, the integrity property is thus mainly focused on the adhesion of the respective laminate layers to its adjacent layers, as well as the quality of the individual material layers. Regarding the laminated barrier film, and edge-covering strip, the integrity is provided both by the internal adhesion between layers of the laminated film structure, and the sealing properties between the laminated film and the packaging material, i.e. the packaging container walls.

According to a first aspect of the invention, the general objects are attained by a laminated barrier film for an edge-covering strip or patch in a liquid carton packaging container, comprising a base layer having a first coating of an amorphous diamond-like carbon (DLC) coating on a first side of the base layer, the coated base layer further having a first outermost liquid tight, heat sealable polymer layer on the first side of the thus coated base layer in contiguous contact with the first DLC coating, and a second outermost liquid tight, heat sealable polymer layer on the opposite, second side of the base layer.

The coating of an amorphous DLC is applied by vapour deposition onto the base layer and accordingly it is contiguous to the surface of the base layer. According to an embodiment, the base layer is a polymer film substrate.

According to an embodiment, the base layer of the film laminate has an adhesion-promoting primer coating on its second side, opposite the side coated with the first DLC coating, and the base layer is bonded to the second outermost liquid tight, heat sealable polymer layer by means of the adhesion-promoting primer coating. The adhesion-promoting primer coating may be formed by a composition comprising one or more compounds selected from the group consisting of aminosilanes and polyethyleneimines.

According to a particular embodiment, however, the adhesion-promoting primer coating is a second coating of an amorphous diamond-like carbon (DLC) coating. The second coating of an amorphous DLC is applied by vapour deposition onto the second side of the base layer and is accordingly also in contiguous contact with the surface of the base layer.

The purpose of the adhesion-promoting primer coating is, to create or improve the adhesion strength to an adjacent extrusion-coated polymer, such as a polyolefin-based polymer layer and the contacting surface thereof.

According to an embodiment of the laminated packaging material, the first outermost liquid tight, heat sealable polymer layer is applied onto the coated base layer to be in direct contact, i.e. contiguous to the first surface of the DLC-coated base layer. According to another embodiment, the second innermost liquid tight, heat sealable polymer layer is applied onto the barrier film to be in direct contact, i.e. contiguous to a second surface of the DLC-coated base layer.

According to a further embodiment, the heat sealable polymer is a polyolefin, such as a polyethylene homo- or copolymer or a polyolefin blend comprising in the majority such a polyethylene polymer. Particularly good adhesion between the DLC coating and an extruded polyethylene layer, why it is believed that the polymer of the outermost heat sealable layers should contain in the majority ethylene monomer units, be it in a polymer blend or in an ethylene copolymer.

According to a particular embodiment, the outermost thermosealable layers comprise a polyethylene selected from the group consisting of linear low density polyethylene (LLDPE), metallocene-LLDPE (m-LLDPE), very low density polyethylene (VLDPE), blends of two or more thereof or blends of any of said polymers with LDPE. The advantage of including such polyethylenes in the outermost thermosealable layer is that a more robust and strong sealing joint may be formed, in a more robust sealing operation, because such polyethylenes can widen the temperature-window of operation at which a sufficiently strong heat seal may be formed. In a further embodiment, an outermost heat sealable layer may be built from two or more part-layers of different polymers, in order to balance the robustness properties and the seal strength properties to each other, as for example with a part-layer of LDPE and a part-layer comprising m-LLDPE.

According to a different embodiment, a first DLC-coated base layer is laminated and bonded to a further identical or similar second DLC-coated base layer by means of an interjacent thermoplastic bonding layer.

Thus, a first DLC-coated base layer is laminated and bonded to a further identical or similar second DLC-coated base layer by means of an interjacent thermoplastic bonding layer, the film laminate further comprising a first outermost liquid tight, heat sealable polymer layer on the opposite, not laminated side of the first DLC-coated polymer film substrate layer and a second outermost liquid tight, heat sealable polymer layer on the opposite, not laminated side of the second DLC-coated polymer film substrate layer.

According to an embodiment of the laminated barrier film, the thermoplastic bonding layer binds together the surface of the DLC coating of the first coated base layer and the surface of the DLC coating of the second coated base layer. According to a further embodiment, the thermoplastic bonding layer comprises an adhesive, or a thermoplastic polymer. According to a special embodiment, the thermoplastic bonding layer is in direct contact, i.e. contiguous to the first surface of the barrier film.

According to an embodiment, the base layer is a polymer film selected from the group consisting of films based on any of polyesters, such as polyethylene terephthalate (PET), mono- or biaxially-oriented PET (OPET, BOPET), non- or mono- or biaxially-oriented polyethylenefuranoate (PEF), oriented or non-oriented polybutylene terephthalate (PBT), polyethylene napthanate (PEN), polyamides, such as, oriented polyamide (PA, OPA, BOPA), ethylene vinyl alcohol copolymers (EVOH), polyolefins such as polypropylene, mono- or biaxially oriented polypropylene (PP, OPP, BOPP), polyethylenes such as oriented or non-oriented high density polyethylene (HDPE), linear low density polyethylene (LLDPE) and cyclo-olefin co-polymers (COC), and blends of any of said polymers, or a multilayer film having a surface layer comprising any of said polymers or blends thereof.

According to another embodiment, the base layer is a film comprising a barrier polymer, which also imparts some mechanical stability to the film, such as, for example, polyester (PET), mono- or biaxially oriented polyester (BO-PET), polyamide (PA), mono or biaxially oriented polyamide (OPA, BOPA), ethylene vinyl alcohol copolymer (EVOH), oriented ethylene vinyl alcohol copolymer (BO-EVOH), blends of two or more of said polymers or co-extruded layers of two or more of said polymers, such as for example oriented coextruded polyamide/ethylene vinyl alcohol copolymer/polyamide (PA/EVOH/PA).

According to a further embodiment, the base layer is a polymer film selected from the group consisting of films based on any of polyesters or polyamides or blends thereof, or multilayer films having a surface layer comprising any of said polymers or blends thereof.

In a further embodiment, the base layer is a polymer film selected from the group consisting of films based on any of polyethylene terephthalate (PET), mono- or biaxially oriented PET (OPET, BOPET), polyamide, oriented polyamide (PA, OPA, BOPA), and blends thereof, or a multilayer film having a surface layer comprising any of said polymers or blends thereof.

In another embodiment, the base layer is a polyamide film, the polyamide being selected from the group consisting of aliphatic polyamides, such as polyamide 6 or polyamide 6,6, semi-aromatic polyamides, such as nylon-MXD6 or Selar, and blends of any of said aliphatic and semi-aromatic polyamides.

According to a further embodiment, the first amorphous diamond-like carbon DLC coating is applied at a thickness from 2 to 50 nm, such as from 5 to 40 nm, such as from 10 to 40 nm, such as from 10 to 35 nm.

According to a different embodiment, the first amorphous diamond-like carbon DLC coating is an adhesion-promoting coating and applied at a thickness from 2 to 50 nm, such as from 2 to 10 nm, such as from 2 to 5 nm.

According to a further embodiment, the second amorphous diamond-like barrier coating is applied at a thickness from 2 to 50 nm, such as from 2 to 40 nm, such as from 2 to 10 nm, such as from 2 to 5 nm.

Laminated barrier film as claimed in any one of the preceding claims, wherein the base layer is an oriented PET film, which may have a thickness of from 8 to 12 μm, preferably from 10 to 12 μm.

Thinner polymer film substrates do exist commercially and would be feasible within the scope of the present invention, but it is presently not realistic to go below 8 μm, and films thinner than 4 μm would be difficult from a web-handling point of view in industrial coating and lamination processes for packaging. On the other hand, films thicker than 12-15 μm are of course feasible but less interesting for laminated packaging materials of the invention from a cost-efficiency view. If the films are thicker than 20 μm there is a risk that they will become stiffer and not sufficiently flexible for the application as edge-covering strips. According to an embodiment, the polymer film substrate should be 18 μm or below, such as an oriented PET film from 10 to 18 μm thick, such as from 10 to 12 μm, such as about 12 μm.

According to a second aspect of the invention, there is provided an edge-covering heat-sealable barrier strip made from the laminated barrier film as defined above.

According to a third aspect of the invention, there is provided a packaging container comprising the edge-covering heat-sealable barrier strip.

According to a fourth aspect of the invention, there is realised a method of manufacturing of the laminated barrier film as defined above, comprising the steps of vapour depositing a coating of an amorphous diamond-like carbon, DLC, onto a pre-manufactured base layer, and laminating the thus DLC-coated base layer to outermost layers of a liquid-tight heat-sealable polymer on both sides of the coated base layer.

According to an embodiment of the method, at least one of the outermost layers of a liquid-tight, heat-sealable polymer are applied by extrusion coating of a polymer melt onto the DLC-coated base layer.

According to another embodiment of the method, at least one of the outermost layers of liquid-tight, heat-sealable polymers are laminated to the DLC-coated base layer in the form of pre-manufactured polymer films.

According to a specific embodiment, the method comprises a further step of surface-treating the DLC-coated base layer before the step of laminating the outermost layers of liquid-tight, heat-sealable polymer to the thus surface-treated, DLC-coated base layer. Suitable surface treatments are plasma treatment, corona treatment, flame treatment and other oxidizing and/or reducing surface treatments. Such a surface treatment ensures that fresh bonding sites are available at the time of lamination to a heated and/or molten polymer layer.

According to a further embodiment of the method, the heat sealable polymer is a polyolefin, such as a polyethylene homo- or co-polymer or a polyolefin blend comprising in the majority such a polyethylene polymer.

According to a particular embodiment, the outermost thermosealable layers comprise a polyethylene selected from the group consisting of linear low density polyethylene (LLDPE), metallocene-LLDPE (m-LLDPE), very low density polyethylene (VLDPE), blends of two or more thereof or blends of any of said polymers with LDPE. The advantage of including such polyethylenes in the outermost thermosealable layer is that a more robust and strong sealing joint may be formed, in a more robust sealing operation, because such polyethylenes can widen the temperature-window of operation at which a sufficiently strong heat seal may be formed. In a further embodiment, an outermost heat sealable layer may be built from two or more part-layers of different polymers, in order to balance the robustness properties and the seal strength properties to each other, as for example with a part-layer of LDPE and a part-layer comprising m-LLDPE.

According to an embodiment of the method, the polymer film substrate layer is a polymer film selected from the group consisting of films based on any of polyesters, such as polyethylene terephthalate (PET), mono- or biaxially oriented PET (OPET, BOPET), mono- or biaxially or non-oriented polyethylenefuranoate (PEF), oriented or non-noriented polybutylene terephthalate (PBT), polyethylene napthanate (PEN), polyamides, such as, oriented or non-oriented polyamide (PA, OPA, BOPA), ethylene vinyl alcohol copolymers (EVOH), polyolefins such as polypropylene, mono- or biaxially oriented polypropylene (PP, OPP, BOPP), polyethylenes such as oriented or non-oriented high density polyethylene (HDPE), linear low density polyethylene (LLDPE) and cyclo-olefin co-polymers (COC), and blends of any of said polymers, or a multilayer film having a surface layer comprising any of said polymers or blends thereof.

According to an embodiment of the method, the first amorphous diamond-like carbon DLC coating is applied at a thickness from 2 to 50 nm, such as from 5 to 40 nm, such as from 10 to 40 nm, such as from 10 to 35 nm.

According to an embodiment of the method, the first amorphous diamond-like carbon DLC coating is an adhesion-promoting coating and applied at a thickness from 2 to 50 nm, such as from 2 to 10 nm, such as from 2 to 5 nm.

According to an embodiment of the method, the second amorphous diamond-like barrier coating is applied at a thickness from 2 to 50 nm, such as from 2 to 10 nm, such as from 2 to 5 nm.

The edge-covering strip from the laminated barrier film having a barrier coating of vapour deposited amorphous diamond-like carbon, shows good properties in many respects, such as having low oxygen transmission rate, OTR, low water vapour transmission, WVTR, good aroma and odour barrier properties and has good mechanical properties in subsequent handling operations, such as in the heat sealing to a laminated packaging material in the fold-forming and sealing operations in producing packages from the material.

In particular, it has been seen that the laminated barrier film according to the invention has excellent integrity, by providing excellent adhesion between the adjacent layers within the laminated construction and by providing good barrier properties. Especially, for the packaging of liquids, and wet food, it is important that the inter-layer adhesion within the laminated barrier film is maintained also under wet packaging conditions. Among various types of vapour deposition barrier coatings, it has been confirmed that this DLC type of vapour deposited barrier coatings, applied by means of a plasma coating technology, such as by plasma enhanced chemical vapour deposition, PECVD, has excellent laminate integrity properties. Barrier coatings from other types of vapour deposition chemistry, such as SiOx or AlOx coatings, do not, on the other hand, show good integrity properties in a laminated material of the same kind under wet and humid conditions. This extraordinary adhesion compatibility of DLC coatings to polyolefins, such as in particular polyethylenes, also under wet conditions was unexpected and surprising, and makes such barrier films particularly suitable for liquid packaging.

Over time, various vapour deposition barrier coatings have been considered in designing laminated packaging materials that fulfil the gas barrier criteria as well as the needs of various mechanical and other physical properties. Vapour deposited barrier layers may be applied by means of physical vapour deposition (PVD) or chemical vapour deposition (CVD) onto a substrate surface of a film material. The substrate material itself may contribute with some properties as well, but should above all have appropriate surface properties, suitable for receiving a vapour deposition coating, and working efficiently in a vapour deposition process.

Thin vapour deposited layers are normally merely nanometer-thick, i.e. have a thickness in the order of magnitude of nanometers, for example of from 1 to 500 nm (50 to 5000 Å), preferably from 1 to 200 nm, more preferably from 1 to 100 nm and most preferably from 1 to 50 nm.

One common type of vapour deposition coating, often having some barrier properties, in particular water vapour barrier properties, is so called metallisation layers, e.g. aluminium metal physical vapour deposition coatings.

Such a vapour deposited layer, substantially consisting of aluminium metal may have a thickness from 5 to 50 nm, which corresponds to less than 1% of the aluminium metal material present in an aluminium foil of conventional thickness for packaging, i.e. 6.3 μm. While vapour deposition metal coatings require significantly less metal material, they only provide a low level of oxygen barrier properties, at most, and need to be combined with a further gas barrier material in order to provide a final laminated material with sufficient barrier properties. On the other hand, it may complement a further gas barrier layer, which does not have water vapour barrier properties, but which is rather sensitive to moisture.

Other examples of vapour deposition coatings are aluminium oxide (AlOx, Al2O3) and silicon oxide (SiOx) coatings. Generally, such PVD-coatings are more brittle and less suitable for incorporation into packaging materials by lamination. Metallised layers as an exception do have suitable mechanical properties for lamination material despite being made by PVD, however generally providing a lower barrier to oxygen gas.

Other coatings which have been studied for laminated packaging materials may be applied by means of a plasma enhanced chemical vapour deposition method (PECVD), wherein a vapour of a compound is deposited onto the substrate under more or less oxidising circumstances. Silicon oxide coatings (SiOx) may, for example, also be applied by a PECVD process, and may then obtain very good barrier properties under certain coating conditions and gas recipes. Unfortunately, SiOx coatings show bad adhesion properties when laminated by melt extrusion lamination to polyolefins and other adjacent polymer layers, and the laminated material is exposed to wet or highly humid packaging conditions. Special, expensive adhesives or adhesive polymers are needed to reach and maintain sufficient adhesion in a packaging laminate of the type intended for liquid carton packaging.

According to this invention, a laminated barrier film has a vapour deposition coating from an amorphous hydrogenated carbon barrier layer applied by a plasma enhanced chemical vapour deposition process, PECVD, a so-called diamond-like carbon (DLC). DLC defines a class of amorphous carbon material that displays some of the typical properties of diamond. Preferably, a hydrocarbon gas, such as e.g. acetylene or methane, is used as process gas in the the plasma for producing the coating. As pointed out above, it has been seen that such DLC coatings, provide good and sufficient adhesion to adjacent polymer or adhesive layers in a laminated packaging material under wet testing conditions. Particularly good adhesion compatibility with adjacent laminated polymer layers, i.e. polymer layers which are adherent to or coated onto the DLC barrier coating, has been seen with polyolefins and in particular polyethylene and polyethylene-based co-polymers.

The DLC barrier coating thus provides good barrier and integrity properties to a laminated barrier film comprising a base layer having the barrier coating, by contributing with good mechanical properties, good barrier properties to various substances migrating through such laminated materials in either direction, as well as by resulting in excellent adhesion to adjacent polymer layers in a laminate. Accordingly, an edge-covering strip, comprising a base layer of a polymer film having a DLC barrier coating can provide a packaging container with oxygen barrier properties as well as water vapour barrier properties, for long-term ambient storage, such as for up to 2-6 months, such as for up to 12 months. In addition, the DLC barrier coating provides good barrier properties to various aroma and flavour substances present in the packed food product, to low-molecular substances possibly appearing in the adjacent layers of materials, and to odours and other gases than oxygen. Moreover, the DLC barrier coating, exhibits good mechanical properties, as coated on a base layer of a polymer film substrate, withstanding lamination and subsequent heat sealing and fold-forming of the laminated barrier film, when employed as edge-covering strip in filled carton packages. For example, polyester and polyamide films provide excellent base layers and substrate surfaces for the initiation and the growth of a DLC coating layer, during the vapour deposition coating process. Favourable conditions in the coating process result in improved coating quality, and thus the coating layer may be made thinner and still achieve the desired barrier properties as well as adhesion and cohesion properties.

The crack-onset strain COS for a biaxially oriented PET film, coated with a DLC barrier coating, may be higher than 2%, and this can normally relate to oxygen barrier properties of the coating not starting to deteriorate until straining the film above 2%.

The DLC barrier coating may be deposited onto a substrate by means of a plasma-assisted coating technology, such as by a magnetron electrode plasma, capacitively coupled to the power, such as described in U.S. Pat. No.

7,806,981 or by a radio-frequency plasma enhanced chemical vapour deposition, inductively coupled and using a carbonaceous precursor, such as described in European patent EP0575299B1.

According to an embodiment, the base layer is a BOPET film of a thickness of 12 µm or lower, such as from 8 to 12 µm. Oriented films usually exhibit an increased strength and toughness against tearing or cutting through the film, and when included in laminated packaging materials such films can cause difficulties in opening of a package. By selecting as thin as possible such polymer film substrates for the base layer, highly flexible edge-covering strips may be obtained, that are readily heat sealable to a packaging material surface.

PET films are robust and cost efficient films with good mechanical properties, and this makes them particularly suitable substrates for DLC vapour deposition coating and also due to some inherent high temperature resistance and relative resistance to chemicals and moisture. The surface of a PET film also has high smoothness and good affinity to vapour deposited DLC coatings and vice versa. According to a further embodiment, the base layer is a BOPET film that has an adhesion primer coating applied to the other side of the BOPET film, in order to provide better bonding to adjacent layers on both sides of the barrier film, when laminating the film into a laminated packaging material.

According to yet another embodiment, the base layer is a BOPET film that has an additional DLC coating applied to the other side of the BOPET film, in order to provide better bonding to adjacent layers on both sides of the barrier film, when laminating the film into a laminated packaging material.

DLC coatings further have the advantage of being recyclable, without leaving residues in the recycled content that contain elements or materials that are not naturally existing in nature and our surrounding environment.

Examples of suitable thermoplastic polymers for the outer heat sealable liquid-tight layers in a laminated film structure of the invention, are polyolefins such as polyethylene and polypropylene homo- or co-polymers, preferably polyethylenes and more preferably polyethylenes selected from the group consisting of low density polyethylene (LDPE), linear LDPE (LLDPE), single-site catalyst metallocene polyethylenes (m-LLDPE) and blends or copolymers thereof. According to an embodiment, the outerheat sealable and liquid-tight layers may be a blend composition of m-LLDPE and LDPE for optimal lamination and heat sealing properties.

According to an alternative embodiment, suitable bonding or tie layers interior of the laminated film, i.e. between the outer heat sealable layer and the barrier- or primer-coated base layer, may be so-called adhesive thermoplastic polymers, such as modified polyolefins, which are mostly based on LDPE or LLDPE co-polymers or, graft co-polymers with functional-group containing monomer units, such as carboxylic or glycidyl functional groups, e.g. (meth)acrylic acid monomers or maleic anhydride (MAH) monomers, (i.e. ethylene acrylic acid copolymer (EAA) or ethylene methacrylic acid copolymer (EMAA)), ethylene-glycidyl(meth)acrylate copolymer (EG(M)A) or MAH-grafted polyethylene (MAH-g-PE). Another example of such modified polymers or adhesive polymers are so called ionomers or ionomer polymers. Preferably, the modified polyolefin is an ethylene acrylic acid copolymer (EAA) or an ethylene methacrylic acid copolymer (EMAA).

Corresponding modified polypropylene-based thermoplastic adhesives or bonding layers may also be useful, depending on the requirements of the finished packaging containers.

Such adhesive polymer layers or tie layers are applied together with the respective outer layer in a co-extrusion coating operation.

However, normally, the use of the above described adhesive polymers should not be necessary for bonding to the DLC barrier coating of the invention. Sufficient and adequate adhesion to polyolefin layers, and in particular to polyethylene layers, as adjacent layers have been concluded, at a level of at least 200 N/m, such as at least 300 N/m. Adhesion measurements are performed at room temperature with a 180° degrees peel force test apparatus (Telemetric Instrument AB), 24 h after the LDPE lamination. Peeling is performed at the DLC/LDPE interface, the peel-arm being the barrier film. When needed, distilled water droplets are added to the peeled interface during peeling to assess the adhesion under wet conditions, i.e. the conditions when the laminated packaging material has been saturated with migrating moisture through the material layers, from the liquid stored in a packaging container made from the laminated material, and/or by storage in a wet or highly humid environment. The given adhesion value is given in N/m and is an average of 6 measurements.

A dry adhesion of more than 200 N/m ensures that the layers do not delaminate under normal package manufacturing conditions, e.g. when bending and fold-forming the laminated material. A wet adhesion of this same level ensures that the layers of the packaging laminate do not delaminate after filling and package formation, during transport and distribution and storage.

The outermost, thermo-sealable polymer layers may be coated directly onto the polymer film substrate having a DLC barrier layer coated thereon, by using common techniques and machines, e.g. those known for the lamination of an aluminum foil, in particular hot lamination (extrusion) of the polymer layer from a molten polymer onto the DLC barrier coating. Also, using a pre-made polymer film and binding it directly to the barrier-coated carrier film by locally melting it, e.g. by applying heat with a hot cylinder or heated roller, is possible. Furthermore, solvent lamination of the polymer layer onto the barrier-coated film is possible, though less preferred from an environmental point of view. From the above it is apparent that the DLC-coated barrier film can be handled in a similar way to an aluminium foil barrier in the lamination and conversion methods into a laminated packaging material, i.e. by means of extrusion lamination and extrusion coating. The lamination equipment and methods do not require any modification, by for example adding specific adhesive polymers or binder/tie layers as may be required in previously known plasma coated materials.

It has been seen that when laminating the DLC barrier coating surface to an adjacent layer of e.g. polyethylene, such as LDPE, the contributing oxygen barrier properties from the barrier film are increased to a 2-3 times higher value. This barrier improvement by merely laminating the DLC barrier coating of the invention into a laminate, cannot be explained by a simple laminate theory, according to which $$1/OTR = SUM_i(1/OTR_i)$$

but does, thus, improve the total barrier beyond the individual contribution of OTR by each laminate layer. It is believed that it is the excellent adhesion between the DLC coating and the polyolefin surface that leads to a particularly well integrated interface between the two materials, and thereby to improved oxygen barrier properties.

In a preferred embodiment of the invention, the peel force strength between the DLC barrier coating layer and the further, laminating, bonding polymer layer as measured by the 180° peel test method under dry and wet conditions (by putting water at the peeling interface) (as described above) is higher than 200 N/m, such as higher than 300 N/m. A dry adhesion of more than 200 N/m ensures that the layers do not delaminate under normal manufacturing conditions, e.g. when bending and fold-forming the laminated material. A wet adhesion of the same level ensures that the layers of the packaging laminate do not delaminate after filling and package formation, during transport, distribution and storage.

A typical laminated carton packaging material suitable for the forming of a liquid carton packaging container of the invention may comprise a paper or paperboard bulk layer, typically having a bending force of 320 mN, and further an outer liquid tight and heat sealable layer of polyolefin applied on the outside of the bulk layer, which side is to be directed towards the outside of a packaging container produced from the packaging laminate. The polyolefin of the outer layer may be a conventional low density polyethylene (LDPE) of a heat sealable quality, but may also include further similar polymers, including LLDPEs. An innermost liquid tight and heat sealable layer is arranged on the opposite side of the bulk layer, which is to be directed towards the inside of a packaging container produced from the packaging laminate, i.e. the innermost layer will be in direct contact with the packaged product. The thus innermost heat sealable layer, which is to form the strongest seals of a liquid packaging container made from the laminated packaging material, comprises one or more in combination of polyethylenes selected from the groups consisting of LDPE, linear low density polyethylene (LLDPE), and LLDPE produced by polymerising an ethylene monomer with a C4-C8, more preferably a C6-C8, alpha-olefin alkylene monomer in the presence of a metallocene catalyst, i.e. a so called metallocene—LLDPE (m-LLDPE). The innermost heat sealable layer may alternatively consist of two or several part-layers of the same or different kinds of LDPE or LLDPE or blends thereof.

The bulk layer is laminated to a barrier film or foil, which accordingly is located between the bulk layer and the innermost heat sealable layer. The barrier film or foil may be an aluminium foil or a barrier coated polymer film.

In a particular embodiment, such a barrier film comprises a substrate layer of a polymer film, such as an oriented PET film having a thickness of 12 μm, which is coated on a first side with a layer of a thin PECVD vapour deposited layer of amorphous, DLC barrier material, at a thickness of from 2-50 nm, such as from 5 to 40 nm. On its second, opposite, side, the polymer film substrate is coated with an adhesion-promoting primer, in this case 2-DEF, a priming composition from Mitsubishi Chemicals. Alternatively, the polymer film substrate may be coated with a second amorphous DLC coating. The second amorphous DLC coating may add barrier properties too, but can also act merely as an adhesion promoting primer coating, and may then have a thickness as low as 2-4 nm.

The first, DLC-coated, side of the thus barrier-coated film is laminated to the bulk layer by an intermediate layer of bonding thermoplastic polymer or by a functionalised polyolefin-based adhesive polymer, in this example by a low density polyethylene (LDPE). The intermediate bonding layer is formed by means of extrusion laminating the bulk layer and the durable barrier film to each other. The thickness of the intermediate bonding layer may be from 7 to 20 μm, more preferably from 12-18 μm. Excellent adhesion will be obtained between these layers, providing good integrity of the laminated material, in that the PECVD-coated DLC barrier coating is containing substantial amounts of carbon material, which exhibits good adhesion compatibility with organic polymers, such as polyolefins, such as in particular polyethylene and polyethylene-based co-polymers.

According to an embodiment of the invention, a packaging container is provided in which the laminated packaging material is a paperboard laminate as described above, with outermost and innermost heat sealable layers and an interior barrier film having a DLC-coating on at least one side, and when fold-formed and sealed into a packaging container has the exposed incision-edges in the longitudinal overlap seal covered by a strip of the laminated barrier film as defined in the appended claims.

EXAMPLES AND DESCRIPTION OF PREFERRED EMBODIMENTS

Figure 1B:
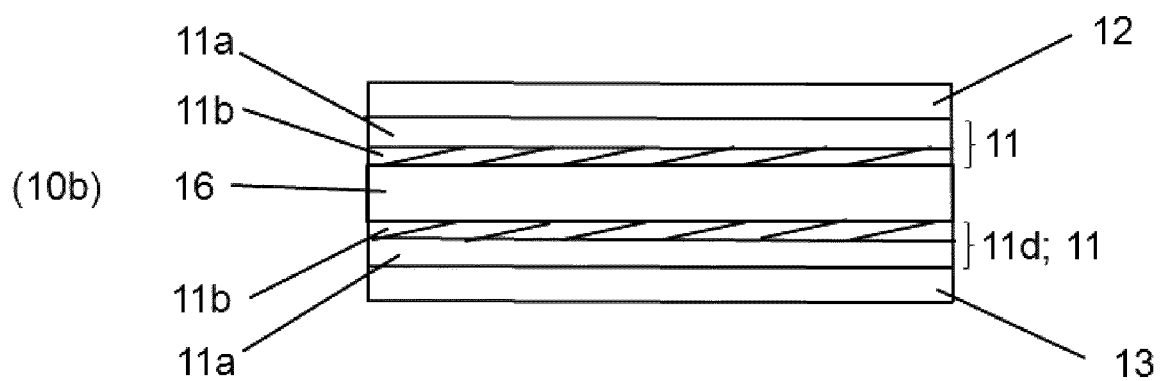
Figure 3:
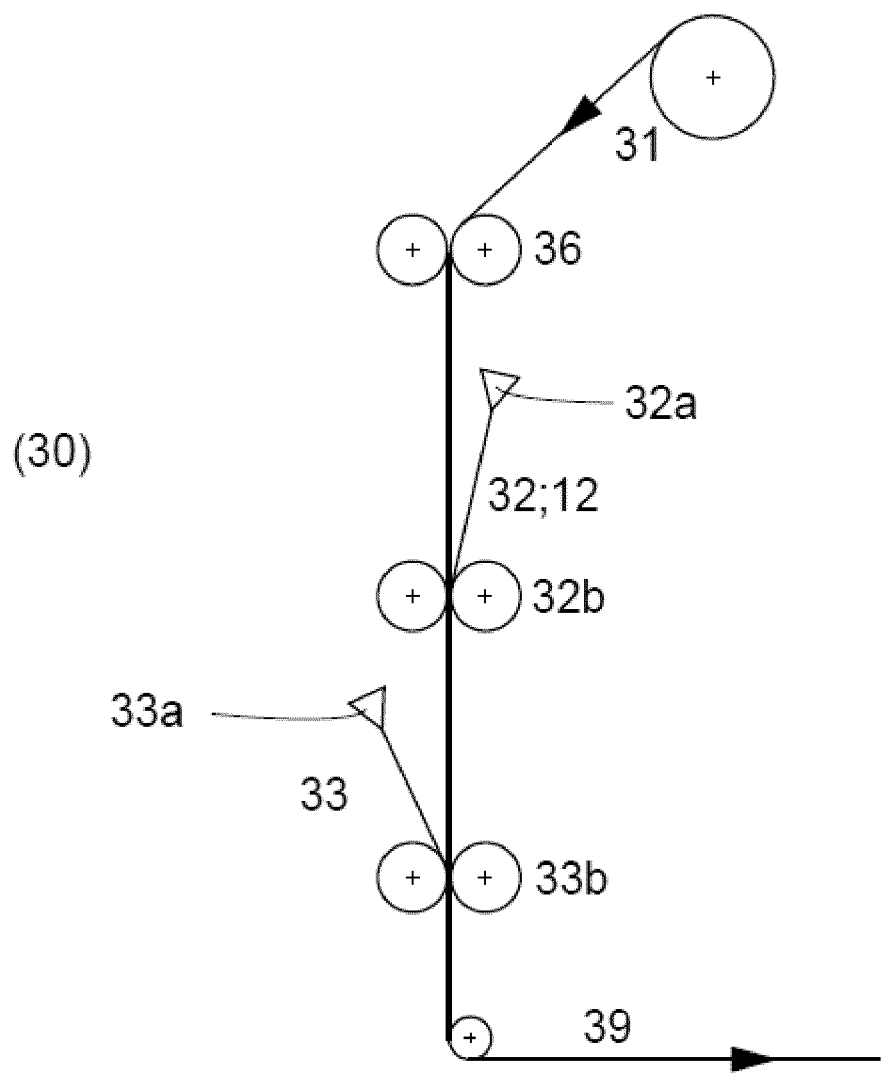
Figure 4:
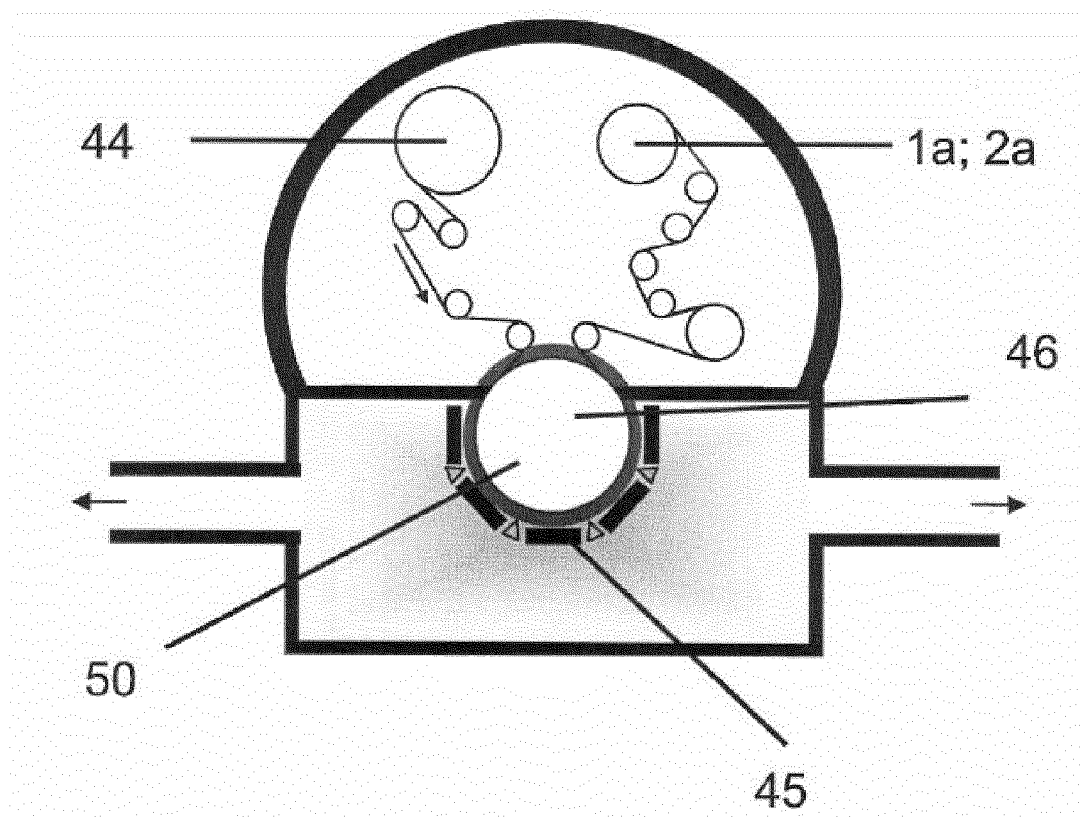
Figure 5A:
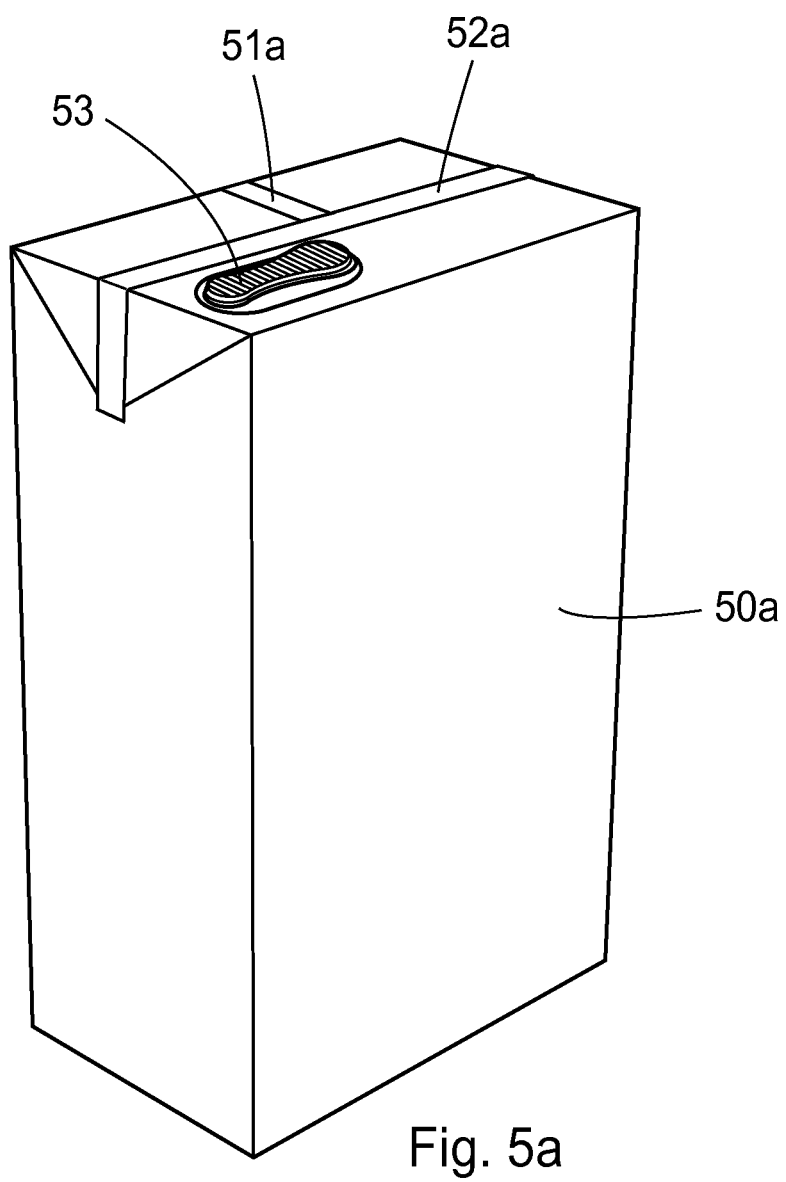
Figure 5B:
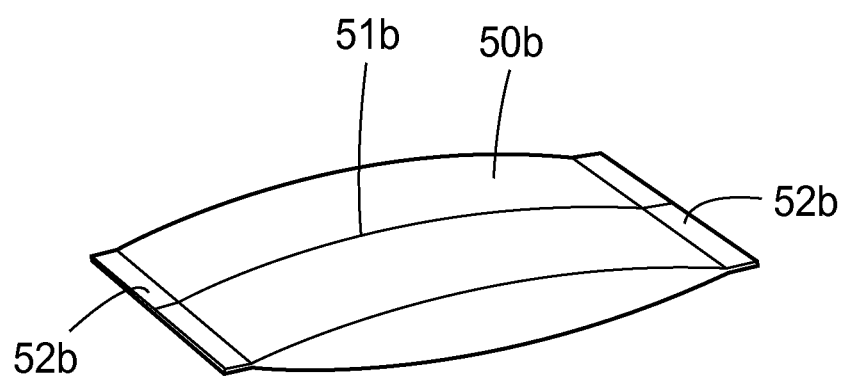
Figure 5C:
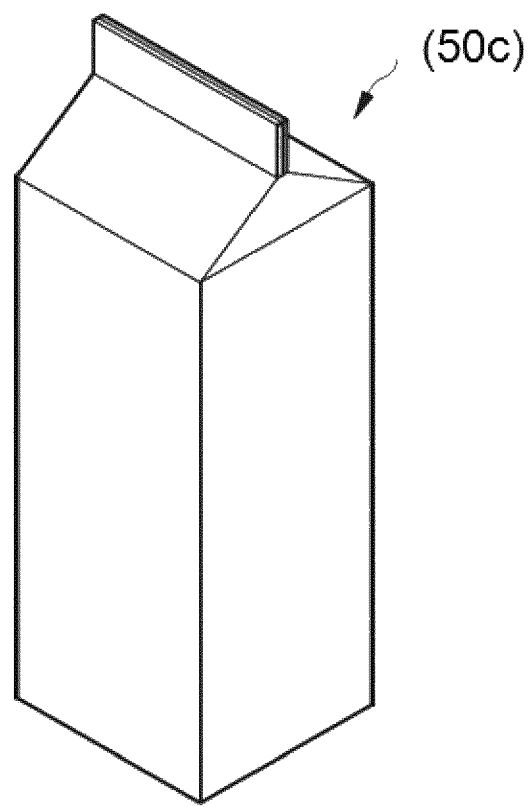
Figure 5D:
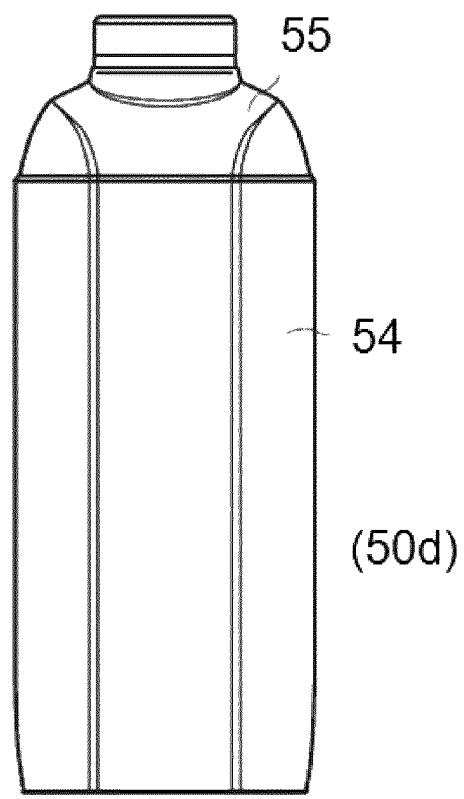
Figure 6:
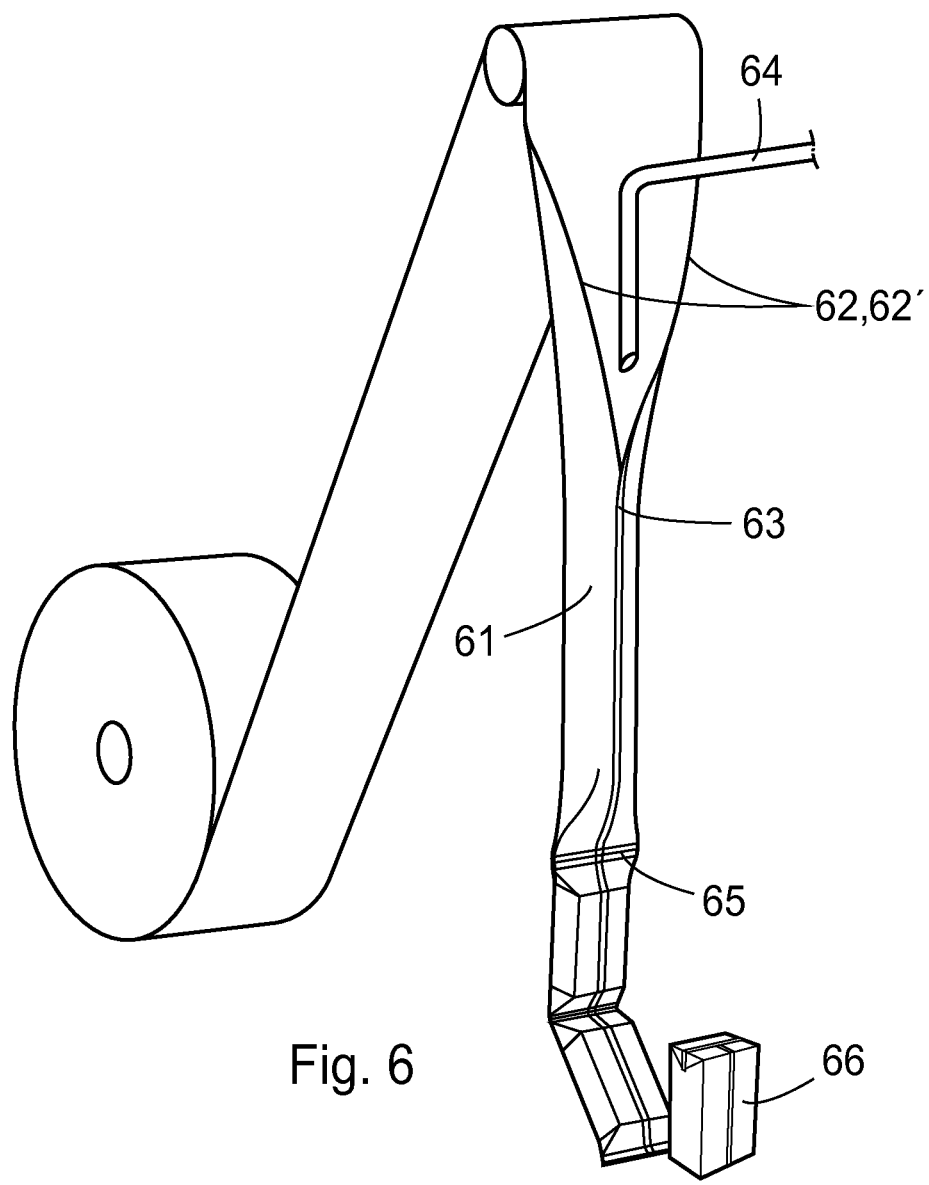

In the following, preferred embodiments of the invention will be described with reference to the drawings, of which:

FIG. 1a is showing a schematic, cross-sectional view of a laminated barrier film of a multilayer type, for a longitudinal seal edge-covering strip, according to an embodiment of the invention, FIG. 1b shows a schematic, cross-sectional view of a further embodiment of a laminated barrier film of the multilayer-type, for a longitudinal seal edge-covering strip, according to a further embodiment of the invention, FIG. 2 shows schematically the use and location of a longitudinal seal edge-covering strip in a packaging container fold-formed, filled and sealed from a carton based packaging laminate, FIG. 3 shows schematically a method for laminating the heat sealable barrier film shown in FIG. 1a, FIG. 4 shows a diagrammatic view of an example of an apparatus for plasma enhanced chemical vapour deposition (PECVD) coating, onto a base layer substrate film, FIGS. 5a, 5b, 5c and 5d are showing typical examples of packaging containers which may be sealed with an edge-covering strip according to the invention, and FIG. 6 is showing the principle of how such packaging containers are manufactured from the packaging laminate in a continuous, roll-fed, form, fill and seal process, the strip application however not shown.

EXAMPLES

Example 1

Films from 12 μm thick biaxially oriented polyethyleneterephthalate (BOPET Hostaphan RNK12 and RNK12-2DEF by Mitsubishi) were deposition coated with various coatings by plasma enhanced chemical vapour deposition (PECVD) under vacuum conditions, in a roll-to-roll plasma reactor. A diamond-like amorphous hydrogenated carbon coating, DLC, was coated on some film samples, in line with the invention, while other PECVD barrier coatings were coated on other samples. The other PECVD barrier coatings, subject of comparative examples, were $SiO_x$, wherein x varied between 1.5 and 2.2, $SiO_xC_y$ coatings and $SiO_xC_yN_z$ coatings, respectively, wherein (y+z)/x is from 1 to 1.5. These other silicon-containing barrier coatings were formed from organosilane pre-cursor gas compounds. The film samples according to the invention, were coated by depositing an amorphous, hydrogenated diamond-like coating DLC from a plasma formed from pure acetylene gas.

The plasma employed was capacitively coupled to the power delivered at 40 kHz frequency, and magnetically confined by unbalanced magnetron electrodes placed at a distance from the circumferential surface of a rotating drum, which functioned as a combined film-web transporting means and electrode. The polymer film substrate was cooled by cooling means within the drum web-transporting means.

The DLC coating was in a first example applied to a thickness of about 15-30 nm, and in a second example to a thickness of only about 2-4 nm.

The SiOx coatings were coated to a thickness of about 10 nm.

The thus barrier-coated substrate film samples, were subsequently extrusion coated with a 15 g/m2 thick layer of low density polyethylene (LDPE), of a type corresponding to LDPE materials of the laminate bonding layer that is conventionally used in order to extrusion laminate paperboard to aluminium foil in liquid carton packaging laminates.

OTR was measured with Oxtran 2-60 (Mocon Inc.) equipment based on coulometric sensors, with a standard deviation of the results being $\pm 0.5$ $cm^3/m^2/day$.

The method for determining OTR identifies the amount of oxygen per surface and time unit at passing through a material at a defined temperature, given atmospheric pressure, and chosen driving force.

Water vapour transmission rate (WVTR) measurements were carried out by a Lyssy instrument (norm: ASTM F1249-01 using a modulated Infrared sensor for relative humidity detection and WVTR measurement) at 38° C. and 90% driving force. This test method is dedicated to measure Water Vapor Transmission Rate (WVTR) properties of films. The procedure is done according to ASTM F1249-01 using a modulated Infrared sensor for relative humidity detection and WVTR measurement.

The adhesion between the thus extrusion coated LDPE layer and the barrier-coated substrate PET film, was measured by a 180° peel test method under dry and wet conditions (by putting distilled water at the peeling interface) as described above. An adhesion of more than 200 N/m ensures that the layers do not delaminate under normal manufacturing conditions, e.g. when bending and fold-forming the laminated material. A wet adhesion of this same level ensures that the layers of the packaging laminate do not delaminate after filling and package formation, during transport, distribution and storage.

As can be seen from the results summarised in Table 1, there is some insufficient dry adhesion between pure SiOx barrier coatings and there onto extrusion coated LDPE, while the adhesion deteriorates completely under wet/humid conditions.

When experimenting with more advanced SiOx formulas, containing also carbon and nitrogen atoms, some improvement is seen in the dry and/or wet adhesion properties, as compared to the pure SiOx coating, but the wet adhesion properties remain insufficient, i.e. below 200 N/m.

The dry adhesion of a DLC coating to extrusion coated LDPE is slightly better than for the best of the tested SiOxCyNz coatings. The more important and unforeseeable difference, compared to the SiOxCyNz coatings is that the adhesion remains constant under wet or humid conditions, such as are the conditions for laminated beverage carton packaging.

Furthermore, and rather surprisingly, the excellent adhesion of DLC coatings at values above 200 N/m, remain unaffected also when the DLC coating is made thinner, and as thin as 2 nm, i.e. where there is actually no notable barrier properties obtained any longer. This is the case both regarding dry and wet conditions for the sample films.

Of course, when such films are laminated into laminated film structures, it is advantageous to coat such a DLC coating on both sides of the base layer, in order to provide excellent adhesion on both sides of the film. Alternatively, the adhesion to adjacent layers on the opposite side of the substrate film may be secured by a separately applied chemical primer composition, such as the 2 DEF® primer from Mitsubishi. A DLC adhesion-promoting layer is preferable from both environmental and cost perspective, since it only involves carbon atoms in the adhesion layer, and since it may be made very thin in order to just provide adhesion, or thicker in order to provide also barrier properties. At any thickness of a DLC-coating, the adhesion obtained is at least as good as that of a chemical primer (such as the 2 DEF® from Mitsubishi) under both dry and wet conditions.

Example 2

A similar BOPET film to the one used in Example 1 was coated with similar thin DLC coatings on one and two sides, as described in Table 2. OTR was measured as $cc/m^2/day/atm$ at 23° C. and 50% RH, by the same method as in Example 1. The DLC-coated films were subsequently laminated into packaging material structures including a paperboard with an outer LDPE layer, by means of a bonding layer of 15 g/m² of LDPE, and by being further coated on the opposite side of the film with an inside layer of a blend of LDPE and mLLDPE at 25 g/m². The OTR was measured on the laminated packaging material by the same method as described previously.

Subsequently, the laminated packaging materials were reformed into 1000 ml standard Tetra Brik® Aseptic packaging containers, on which the total oxygen transmission was further measured, by a Mocon 1000 equipment at 23° C. and 50% RH.

TABLE 1

| Coating type | Oxygen Barrier | Water Vapour Barrier | PE-laminate Peel force (N/m) Dry adhesion | PE-laminate Peel force (N/m) wet adhesion |
|---|---|---|---|---|
| SiOx (x = 1.5-2.2) | <3 cc at 3⁶ Mean 1.5 cc | N/A | 40-50 | 0 |
| SiOxCy (y/x = 1-1.5) | <3 cc at 3⁶ Mean 1.5 cc | 1 | 40-50 | 40-50 |
| SiOxCyNz (y + z/x = 1-1.5) | <3 cc at 3⁶ Mean 1.5 cc | 1 | 200-300 | 100 |
| DLC ~25 nm | <3 cc at 3⁶ Mean 1.5 cc | 0.8 | 350-400 | 350-400 |
| DLC ~25 nm on both sides of film | 0.5 ± 0.05 | 0.5 | 350-400 | 350-400 |
| DLC 2-4 nm | 60-80 | 5-6 | 350-400 | 350-400 |
| DLC 2-4 nm on both sides of film | 60-80 | 5-6 | 350-400 | 350-400 |

| Test ID | Film structure | Thickness DLC 1 coating (nm) | Thickness DLC 2 coating (nm) | OTR Film (mean) | OTR packaging material (mean) | OTR Package (mean) |
| --- | --- | --- | --- | --- | --- | --- |
| A | /BOPET/DLC2/ | — | 3.4 | 21.8 | — | — |
| A | /DLC1/BOPET/DLC2/ | 11.9 | 3.4 | 1.1 | 1.6 | 0.037 |
| B | /BOPET/DLC2/ | — | 3.4 | 19.3 | — | — |
| B | /DLC1/BOPET/DLC2/ | 3.5 | 3.4 | 10.5 | 1.8 | 0.027 |

Very surprisingly, it was found that when measured on laminated packaging material, and on packages from the packaging material, the oxygen barrier properties were on the same level or even improved by the film of Test B, although the film in Test B was coated with only two very thin DLC coatings, while in Test A, one of the coatings was thicker and actually intended for providing the resulting oxygen barrier properties of the film. By the measurements on the barrier-coated films, the film of Test A was indeed better, but when laminated into a final laminated packaging material structure, and used in a packaging container, both the two films were performing very well, and the film of Test B was even performing better than the film of Test A.

Thus by the DLC-coated barrier films described above, high-integrity film laminates are provided, which have maintained excellent adhesion between layers also when used in liquid packaging, i.e. at subjecting the laminated material to wet conditions, and which may consequently protect other layers of the laminated film from deterioration, in order to provide as good laminated material properties as possible. Since DLC coatings in general provide both good oxygen barrier properties and water vapour barrier properties, it is a highly valuable type of barrier coating to be used in carton packaging for liquid food products.

Further, relating to the attached figures:

In FIG. 1a, there is shown, in cross-section, a first embodiment of a laminated packaging material, 10, of the invention. It comprises a barrier film 11 having a substrate layer 11a of a polymer film having a surface of PET or PA, in this case an oriented PET (BOPET) film having a thickness of 12 μm, wherein the substrate layer is coated with an, amorphous DLC coating 11b, by means of a plasma enhanced chemical vapour deposition, PECVD, coating, in order to improve the oxygen barrier (decrease the OTR value) of the barrier film. The vapour deposited coating 11b is a hydrogenated carbon coating (C:H) which is evenly deposited to a substantially transparent coating. The thickness of the DLC coating is 20 to 40 μm. On its other side, opposite to the DLC barrier coating, the film substrate is coated with a thin layer of an adhesion-promoting primer 11c, such as 2-DEF, a priming composition from Mitsubishi Chemicals. The barrier film is laminated to a layer of a thermoplastic and heat sealable polymer layer on each side, 12, 13, which may or may not be identical. The thermoplastic and heat sealable polymer layers are preferably polyolefin based polymers, and form the outermost, heat sealable layers of the laminate.

According to an alternative embodiment, the barrier film 11 as schematically shown in FIG. 1a, has instead, on its other side, opposite to the DLC barrier coating, been coated with a different thin layer of an adhesion-promoting, and/or barrier coating, layer 11c, of a further DLC PECVD coating.

In FIG. 1b, a similar barrier film 11 is provided, by a polymer film substrate 11a as in FIG. 1a, i.e. a BOPET film substrate, being vapour deposition coated on the coating side with a similar, amorphous DLC coating 11b, by means of plasma enhanced chemical vapour deposition coating, PECVD, in order to improve the oxygen barrier (decrease the OTR value). On its other side, opposite to the durable DLC barrier coating, the film substrate may be coated with a thin layer of an adhesion-promoting primer 11c of a DLC PECVD coating (optional, not shown). The barrier film 11 is laminated to a further identical or similar barrier film 11; 11d, by means of an interjacent bonding layer 16 of a thermoplastic polymer, such as a polyolefin or modified polyolefin layer, such as a layer of LLDPE or a multilayer configuration of several individually identical or different polyethylene layers. The intermediate bonding layer is thus bonding to the DLC coating surfaces of both barrier films 11; 11d. On each side the barrier film is further laminated to an outer layer of a thermoplastic and heat sealable polymer layer 12 and 13 respectively. Thus, the outermost layers of thermoplastic and heat sealable polymer are each contacting the adhesion-promoting primer coatings 11c (optional), of a DLC primer coating of each of the barrier films 11; 11d. A possible alternative adhesion-promoting coating 11c could be a chemical primer coating of the type 2 DEF® from Mitsubishi.

In such a double-film structure the intermediate bonding layer may be bonding together the DLC barrier-coated surfaces 11b of two barrier films 11; 11d. The double film structure may contain further DLC coatings 11c for barrier and/or for adhesion-promotion purposes.

FIG. 2 is a perspective view of an example of a packaging container, with an enlarged partial cross-section of the longitudinal, overlapping seal of a typical carton-based packaging container of the Tetra Brik® type. On the inside of the packaging container 21, along the vertical, longitudinal seal section 23, in which the container wall surfaces are overlapping, a heat seal joint is formed. A carton-based laminated packaging material 24 is overlaid in the longitudinal seal section 23 as shown in the enlarged cross-sectional view. Along and on top of the exposed inner longitudinal edge 25 of the overlapping laminated material 24, an edge-covering strip 26 is applied by heat sealing of one of the outermost polymer layers of the strip 26 to the innermost heat sealable, product-contacting layer of the laminated packaging material 24.

In FIG. 3, a lamination process 30 is shown, for the manufacturing of the laminated barrier film 10a of FIG. 1a, wherein the DLC-coated base layer 31 is laminated to the outermost heat sealable layers 32; 12 and 33; 13 by means of extrusion coating. The coated base layer is thus forwarded through a lamination nip under simultaneous extrusion coating with a molten polymer curtain of the polymer for the outermost layer 32; 12 in a first step, and further forwarded through a second lamination nip under simultaneous extrusion coating with a molten polymer curtain of the polymer for the outermost layer 33; 13 in a second step. The outermost layers may alternatively be extrusion coated in the two steps in the reverse order.

The base layer 31 passes thus first an extruder feedblock 32a and a lamination nip 32b where an innermost heat sealable layer 12; 32 is coated onto the DLC-coated side of the base layer. In the second step, the base layer, including the innermost heat sealable layer 12; 32, passes a third extruder feedblock 33a and a lamination nip 33b, where an outermost heat sealable layer of LDPE 13; 33 is coated onto the other side of the base layer. The finished laminated barrier film 39 is finally wound onto a storage reel, not shown.

FIG. 4 shows a diagrammatic view of an example of a plant for plasma enhanced vapour deposition coating, PECVD, of hydrogenated amorphous diamond-like carbon coatings onto a base layer being a polymer film substrate. The film substrate 44 is subjected, on one of its surfaces, to continuous PECVD, of a plasma, 50, from a plasma reaction zone created in the space between magnetron electrodes 45, and a chilled film-transporting drum 46, which is also acting as an electrode, while the film is forwarded by the rotating drum, through the plasma reaction zone along the circumferential surface of the drum. The plasma is formed from one or more gaseous organic hydrocarbon, such as acetylene or methane, and the coating is applied to a thickness of 1-500 nm, preferably 2-100 nm, such that a deposition coated film 10a or 10b is formed, respectively.

FIG. 5a shows an embodiment of a packaging container 50a produced from the packaging laminate 20 according to the invention. The packaging container is particularly suitable for beverages, sauces, soups or the like. Typically, such a package has a volume of from about 100 to 1000 ml. It may be of any configuration, but is preferably brick-shaped, having longitudinal and transversal seals 51a and 52a, respectively, and optionally an opening device 53. In another embodiment, not shown, the packaging container may be shaped as a wedge. In order to obtain such a "wedge-shape", only the bottom part of the package is fold formed such that the transversal heat seal of the bottom is hidden under the triangular corner flaps, which are folded and sealed against the bottom of the package. The top section transversal seal is left unfolded. In this way the half-folded packaging container is still is easy to handle and dimensionally stable when put on a shelf in the food store or on a table or the like.

FIG. 5b shows an alternative, preferred example of a packaging container 50b produced from an alternative packaging laminate 20 according to the invention. The alternative packaging laminate is thinner by having a thinner paper bulk layer 21, and thus it is not dimensionally stable enough to form a cuboid, parallellepipedic or wedge-shaped packaging container, and is not fold formed after transversal sealing 52b. It will thus remain a pillow-shaped pouch-like container and be distributed and sold in this form. Also packaging materials of the type described in connection with FIG. 1b, are particularly suitable for such pouch packages for liquid food and beverage.

FIG. 5c shows a gable top package 50c, which is fold-formed from a pre-cut sheet or blank, from the laminated packaging material comprising a bulk layer of paperboard and the durable barrier film of the invention. Also flat top packages may be formed from similar blanks of material.

FIG. 5d shows a bottle-like package 50d, which is a combination of a sleeve 54 formed from a pre-cut blanks of the laminated packaging material of the invention, and a top 55, which is formed by injection moulding plastics in combination with an opening device such as a screw cork or the like. This type of packages are for example marketed under the trade names of Tetra Top® and Tetra Evero®. Those particular packages are formed by attaching the moulded top 55 with an opening device attached in a closed position, to a tubular sleeve 54 of the laminated packaging material, sterilizing the thus formed bottle-top capsule, filling it with the food product and finally fold-forming the bottom of the package and sealing it.

FIG. 6 shows the principle as described in the introduction of the present application, i.e. a web of packaging material is formed into a tube 61 by the longitudinal edges 62 of the web being united to one another in an overlap joint 63. The tube is filled 64 with the intended liquid food product and is divided into individual packages by repeated transversal seals 65 of the tube at a pre-determined distance from one another below the level of the filled contents in the tube. The packages 66 are separated by incisions in the transversal seals and are given the desired geometric configuration by fold formation along prepared crease lines in the material.

We have thus seen that the laminated packaging material of the invention, enables the providing of packaging containers with good integrity properties also under wet conditions, i.e. for the packaging of liquid or wet food products with long shelf life.

The invention is not limited by the embodiments shown and described above, but may be varied within the scope of the claims.

A sealing strip made from the laminated barrier film according to the present invention is thus intended to be employed as protection against liquid penetration in edge wicking incision edges on the inside of conventional packaging containers for liquid foods such as, for example, milk, juice, cooking oil, wine etc. In particular, the sealing strip is intended to be employed as protection against such edge wicking in conventional, well-known packaging containers of the types Tetra Brik, Tetra Wedge, Tetra Prisma (all registered trademarks) which all share the common feature that they are produced by packing and filling machines which, from a web of packaging material of plastic-coated paper or paperboard form, fill and seal aseptic packages in a continuous production process at extremely high production output speeds, of the order of from 15,000 and up to 20,000 packages per hour or even more. While the present invention has been described above with reference to specific embodiments and practical applications, it is naturally not restricted exclusively to these illustrated and described embodiments. It will be obvious to the skilled reader of this specification possessing the knowledge of the present invention that numerous modifications, alterations and variations are possible without departing from the scope of the inventive concept as this is defined in the appended claims.

The invention claimed is:

1. A packaging container comprising:
   (a) overlapping laminated sheets of a packaging material, wherein a longitudinal edge of at least one of the sheets faces towards the inside of the packaging container, and
   (b) an edge-covering, heat-sealable barrier strip, laminated to an innermost, heat sealable product-contacting layer of the packaging container, wherein the edge-covering, heat sealable barrier strip covers the longitudinal edge so that the longitudinal edge is not exposed to contents inside of the packaging container, and wherein the edge-covering heat-sealable barrier strip is made from a laminated barrier film comprising:
      (i) a base layer comprising a first coating of an amorphous diamond-like carbon (DLC) coating on a first side of the base layer,
      (ii) a first outermost liquid tight, heat sealable polymer layer on the first side of the coated base layer in contiguous contact with the first DLC coating, and (iii) a second outermost liquid tight, heat sealable polymer layer on the opposite, second side of the base layer.

2. The packaging container of claim 1, wherein the base layer of the laminated barrier film has an adhesion-promoting primer coating on its second side, opposite the side coated with the first DLC coating, and wherein the base layer is bonded to the second outermost liquid tight, heat sealable polymer layer by the adhesion-promoting primer coating.

3. The packaging container of claim 1, wherein the adhesion-promoting primer coating is a second coating of an amorphous diamond-like carbon (DLC) coating.

4. The packaging container of claim 1, wherein the heat sealable polymer of the first outermost liquid tight, heat sealable polymer layer and/or the second outermost liquid tight, heat sealable polymer layer is a polyolefin or a polyolefin blend comprising a polyethylene polymer.

5. The packaging container of claim 1, wherein the first coating of the amorphous diamond-like carbon (DLC) coating is laminated and bonded to a further identical or similar second amorphous DLC-coated base layer by an interjacent thermoplastic bonding layer, and wherein the second amorphous DLC-coated base layer is in contiguous contact with the first outermost liquid tight, heat sealable polymer layer.

6. The packaging container of claim 1, wherein the base layer comprises a polymer film comprising a polymer selected from the group consisting of a polyester a polyamide, an ethylene vinyl alcohol copolymer (EVOH), a polyolefin, and a blend of any of said polymers.

7. The packaging container of claim 6, wherein the base layer comprises a, multilayer film having a surface layer comprising at least one of said polymers.

8. The packaging container of claim 1, wherein the first amorphous diamond-like carbon DLC coating is 2 to 100 nm thick.

9. The packaging container of claim 1, wherein the first amorphous diamond-like carbon DLC coating is an adhesion-promoting coating and is 2 to 50 nm thick.

10. The packaging container of claim 5, wherein the second amorphous diamond-like barrier coating is 2 to 50 nm thick.

11. The packaging container of claim 6, wherein the polymer is a polyester selected from the group consisting of polyethylene terephthalate (PET), mono- or biaxially oriented PET (OPET, BOPET), non- or mono- or biaxially oriented polyethylenefuranoate (PEF), oriented or non-oriented polybutylene terephthalate (PBT), polyethylene napthanate and (PEN).

12. The packaging container of claim 6, wherein the polymer is a polyamide or a non-oriented polyamide.

13. The packaging container of claim 6, wherein the polymer is a polyolefin selected from the group consisting of polypropylene, mono- or biaxially oriented polypropylene (PP, OPP, BOPP), polyethylene and a cyclo-olefin co-polymer (COC).

14. The packaging container of claim 13, wherein the polymer is a polyethylene selected from the group consisting of oriented or non-oriented high-density polyethylene (HDPE), linear low-density polyethylene (LLDPE).

* * * * *